United States Patent
Kim et al.

(10) Patent No.: US 8,895,156 B2
(45) Date of Patent: Nov. 25, 2014

(54) ORGANIC LIGHT EMITTING DIODE AND ORGANIC LIGHT EMITTING DISPLAY HAVING THE SAME

(75) Inventors: Tae-Shick Kim, Yongin-si (KR); Ok-Keun Song, Yongin-si (KR); Hye-In Jeong, Yongin-si (KR); Young-Mo Koo, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1882 days.

(21) Appl. No.: 11/723,068

(22) Filed: Mar. 16, 2007

(65) Prior Publication Data

US 2008/0118775 A1 May 22, 2008

(30) Foreign Application Priority Data

Nov. 21, 2006 (KR) .................. 10-2006-0115145

(51) Int. Cl.
- *B32B 9/00* (2006.01)
- *H01L 51/00* (2006.01)
- *H01L 51/50* (2006.01)
- *B82Y 10/00* (2011.01)

(52) U.S. Cl.
CPC ........ *H01L 51/5052* (2013.01); *H01L 51/0072* (2013.01); *H01L 51/0046* (2013.01); *H01L 51/0051* (2013.01); *H01L 51/0081* (2013.01); *B82Y 10/00* (2013.01); *Y10S 428/917* (2013.01)
USPC ............. 428/690; 428/917; 428/336; 257/40; 257/88; 257/104

(58) Field of Classification Search
USPC ......................................... 428/690
See application file for complete search history.

(56) References Cited

U.S. PATENT DOCUMENTS

| | | | |
|---|---|---|---|
| 2005/0040390 A1* | 2/2005 | Pfeiffer et al. | 257/40 |
| 2005/0208327 A1* | 9/2005 | Begley et al. | 428/690 |
| 2006/0081840 A1* | 4/2006 | Mori et al. | 257/40 |
| 2007/0046189 A1* | 3/2007 | Hatwar et al. | 313/506 |
| 2007/0145355 A1* | 6/2007 | Werner et al. | 257/40 |

FOREIGN PATENT DOCUMENTS

| | | |
|---|---|---|
| JP | 2007-129170 | 5/2007 |
| KR | 2006-28385 | 3/2006 |
| KR | 2006-35741 | 4/2006 |
| KR | 2007-9456 | 1/2007 |

OTHER PUBLICATIONS

Guldi et al. J. Phys. Chem. 194, 98, 4617-4621.*
Meng et al. Appl. Phys. Lett., vol. 82 (2003), pp. 3788-3790.*
Doizi et al. J. Phys. Chem., vol. 91 (1987), pp. 3524-3530.*
Guldi et al. J. Phys. Chem. 1994, 98, p. 4617.*

* cited by examiner

*Primary Examiner* — J. L. Yang
(74) *Attorney, Agent, or Firm* — Robert E. Bushnell, Esq.

(57) ABSTRACT

An organic light emitting diode that can improve a driving voltage and emission efficiency includes a first electrode, an organic layer formed on the first electrode and including an emitting layer and an electron transport layer that is doped with an organic n-type impurity, and a second electrode formed on the organic layer. The electron transport layer is made of C60. An organic light emitting display includes the organic light emitting diode.

21 Claims, 3 Drawing Sheets

ORGANIC LIGHT EMITTING DIODE AND
ORGANIC LIGHT EMITTING DISPLAY
HAVING THE SAME

CROSS-REFERENCE TO RELATED APPLICATIONS

This application claims the benefit of Korean Patent Application No. 2006-115145 filed on Nov. 21, 2006, in the Korean Intellectual Property Office, the disclosure of which is incorporated herein by reference in its entirety.

BACKGROUND OF THE INVENTION

1. Field of the Invention

Aspects of the present invention relate to an organic light emitting diode, and more particularly, to an organic light emitting diode that can improve a driving voltage and emission efficiency and an organic light emitting display having the same.

2. Description of the Related Art

An organic light emitting display is a self-emitting display using a phenomenon in which electrons and holes injected into an organic material through an anode and a cathode are recombined to form excitons, thereby causing a light beam with a specific wavelength to be generated by the energy of the formed excitons. The organic light emitting display does not require a separate light source such as a backlight, and therefore has a low power consumption. Furthermore, since a wide viewing angle and a fast response time can be easily ensured, the organic light emitting display is promising as a next generation display.

In terms of a driving method, organic light emitting displays are classified into a passive matrix type and an active matrix type. In recent years, the active matrix type has become more popular than the passive matrix type because of advantages in low power consumption, high definition, fast response time, wide viewing angle, and thinness and lightness.

In such an active matrix type organic light emitting display, a pixel region is formed on a substrate so as to display an actual image, and pixels, each of which is a basic unit of an image, are arranged in a matrix form. An organic light emitting diode is disposed for each pixel. The organic light emitting diode is constructed such that a first pixel electrode (anode) and a second pixel electrode (cathode) are sequentially formed with an emitting layer including a red (R), green (G), or blue (B) organic material interposed therebetween. A thin film transistor (TFT) is in contact with the organic light emitting diode for each pixel so that each pixel can be separately controlled.

A driving voltage of the organic light emitting display depends on the first pixel electrode, the emitting layer, and the second pixel electrode forming the organic light emitting diode. With larger sized organic light emitting displays with higher brightness, the driving voltage as well as power consumption increases. Therefore, an interface of the organic light emitting diode has to be regulated so as to effectively transport electrons and holes.

SUMMARY OF THE INVENTION

Aspects of the present invention provide an organic light emitting diode that can improve the driving voltage and emission efficiency of the diode.

Aspects of the present invention also provide an organic light emitting display having the organic light emitting diode mentioned above and capable of reducing power consumption.

According to an embodiment of the invention, there is provided an organic light emitting diode comprising a first electrode, an organic layer formed on the first electrode and including an emitting layer and an electron transport layer comprising C60 that is doped with an organic n-type impurity, and a second electrode formed on the organic layer.

According to an aspect of the present invention, the organic n-type impurity may be pyronine B or dicarbocyanine iodide.

According to an aspect of the present invention, the electron transport layer may have a thickness in a range of 100 Å to 400 Å.

According to another embodiment of the invention, there is provided an organic light emitting diode comprising a first electrode, an organic layer formed on the first electrode and including the following layers sequentially laminated: a hole injection layer, a hole transport layer, a emitting layer, and a doped electron transport layer comprising C60 doped with an organic n-type impurity, and a second electrode formed on the organic layer.

According to an aspect of the present invention, the organic n-type impurity is pyronine B or dicarbocyanine iodide.

According to an aspect of the present invention, the electron transport layer may have a thickness in a range of 100 Å to 400 Å.

According to an aspect of the present invention, the organic layer may further comprise an electron injection layer formed between the doped electron transport layer and the second electrode. The electron injection layer may be made of a material selected from a group consisting of Li, Cs, Mg, $BaF_2$, LiF, NaCl, CsF, $Li_2O$, BaO, $CaF_2$, $Cs_2CO_3$, $Cs_2O$, CaO, $MgF_2$, MgO, and Liq.

According to an aspect of the present invention, the organic layer may further comprise an undoped electron transport layer formed between the doped electron transport layer and the second electrode.

According to an aspect of the present invention, the organic layer may further comprise a first undoped electron transport layer formed between the doped electron transport layer and the emitting layer, and a second undoped electron transport layer formed between the doped electron transport layer and the second electrode.

According to another embodiment of the invention, there is provided an organic light emitting display comprising a substrate, and an organic light emitting diode formed on the substrate and including a first electrode, an organic layer formed on the first electrode and in which the following layers are sequentially laminated: a hole injection layer, a hole transport layer, an emitting layer, and a doped electron transport layer comprising C60 doped with an organic n-type impurity, and a second electrode formed on the organic layer.

According to an aspect of the present invention, the organic n-type impurity may be pyronine B or dicarbocyanine iodide.

According to an aspect of the present invention, the electron transport layer may have a thickness in a range of 100 Å to 400 Å.

According to an aspect of the present invention, the organic layer may further comprise an electron injection layer formed between the doped electron transport layer and the second electrode. The electron injection layer may be made of a material selected from a group consisting of Li, Cs, Mg, BaF$_2$, LiF, NaCl, CsF, Li$_2$O, BaO, CaF$_2$, Cs$_2$CO$_3$, Cs$_2$O, CaO, MgF$_2$, MgO, and Liq.

According to an aspect of the present invention, the organic layer may further comprise an undoped electron transport layer formed between the doped electron transport layer and the second electrode.

According to an aspect of the present invention, the organic layer may further comprise a first undoped electron transport layer formed between the doped electron transport layer and the emitting layer, and a second undoped electron transport layer formed between the doped electron transport layer and the second electrode.

According to an aspect of the present invention, the organic light emitting display may further comprise a thin film transistor electrically connected to the organic light emitting diode and formed on the substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures. As those skilled in the art would realize, the described embodiments may be modified in various different ways, all without departing from the spirit or scope of the present invention.

First, an organic light emitting diode according to a first embodiment of the present invention will be described with reference to FIG. 1.

Figure 1:
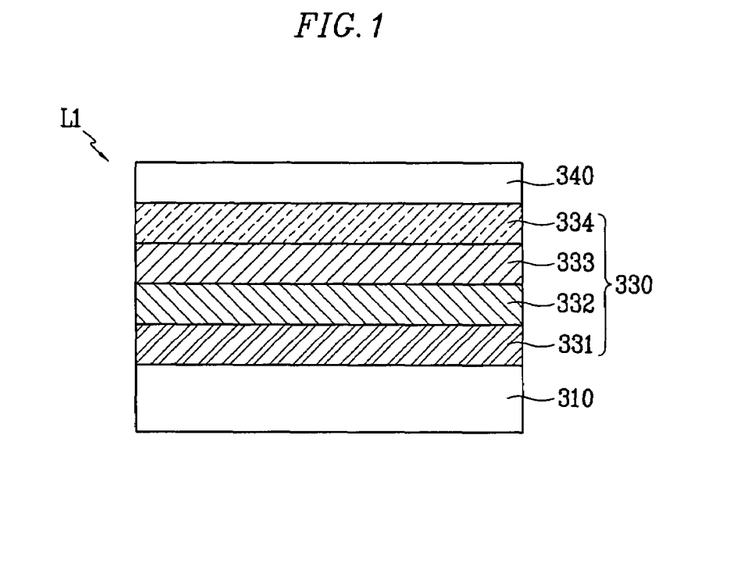
FIG. 1 is a cross-sectional view of an organic light emitting diode according to an embodiment of the present invention.

Referring to FIG. 1, an organic light emitting diode L1 includes a first electrode 310 (for example, an anode), an organic layer 330, and a second electrode 340 (for example, a cathode), which are sequentially laminated. The organic layer 330 may have a structure in which multi-layered organic thin films are laminated. For example, the multilayered organic thin films may include a hole injection layer (HIL) 331, a hole transport layer (HTL) 332, an emitting layer (EML) 333, and an electron transport layer (ETL) 334 doped with an organic n-type impurity, which are sequentially laminated.

The first electrode 310 may be a first transparent electrode composed of indium tin oxide (ITO) or indium zinc oxide (IZO). According to an emission direction of the organic light emitting diode L1, a conductive reflection layer and a second transparent electrode may be further formed on the first transparent electrode. The reflection layer reflects light generated from the organic layer 330 so as to improve emission efficiency and electrical conductivity. For example, the reflection layer may be made of aluminum (Al), aluminum alloy (Al-alloy), silver (Ag), silver alloy (Ag-alloy), gold (Au), or gold alloy (Au-alloy). The second transparent electrode not only reduces oxidation of the reflection layer but also improves a work function relation between the organic layer 330 and the reflection layer. For example, the second transparent electrode may be made of ITO or IZO, the same as the first transparent electrode.

The second electrode 340 may be made of a transparent metallic oxide having an excellent conductivity, for example, indium tin oxide (ITO), indium zinc oxide (IZO), tin oxide (SnO$_2$), or zinc oxide (ZnO). Alternatively, the second electrode 340 may be constructed with a transparent or reflective metallic thin film such as, for example, lithium (Li), magnesium (Mg), aluminum (Al), aluminum-lithium (Al—Li), calcium (Ca), magnesium-indium (Mg—In), magnesium-silver (Mg—Ag), or calcium-aluminum (Ca—Al). However, the present invention is not limited thereto.

Although the first electrode 310 is described herein as the anode and the second electrode 340 is described herein as the cathode, it is also possible for the first electrode 310 to function as a cathode, and the second electrode 340 to function as an anode.

The hole injection layer 331 and the hole transport layer 332 of the organic layer 330 effectively move holes injected from the first electrode 210 to the emitting layer 333.

The hole injection layer 331 may be made of any known hole injection material, such as, for example, copper phthalocyanine (CuPc) or starburst-type amines. However, the embodiment of the present invention is not limited thereto. As non-limiting examples, the starburst-type amines may be 4,4', 4"-tris(N-carbazolyl)-triphenylamine (TCTA) expressed by Chemical Formula 1, 4,4',4"-tris(N-3-metylph-enyl-N-phenyl-amino)-triphenylamine (m-MTDATA) expressed by Chemical Formula 2, polyaniline/dodecylbenzenesulfonic acid (Pani/DBSA) expressed by Chemical Formula 3 and produced by Idemitsu (JP), or poly(3,4-ethylenediox-ythiophene)/poly(4-styrenesulfonate) (PEDOT/PSS) expressed by Chemical Formula 4.

[Chemical Formula 1]

TCTA

[Chemical Formula 2]

m-MTDATA

[Chemical Formula 3]

[Chemical Formula 4]

The hole transport layer 332 may be made of any known hole transport material, such as, for example, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD) expressed by Chemical Formula 4, N,N'-di (naphthalene-1-yl)-N,N'-diphenyl benzidine(α-NPD) expressed by Chemical Formula 5, N,N'-diphenyl-N,N'-bis (1-naphtyl)-(1,1'-biphenyl)-4,4'-diamine (NPB), IDE320 (produced by Idemitsu (JP)), poly(9,9-dioctylfluorene-co-N-(4-butylphenyl)diphenylamine) (TFB), or poly(9,9-dioctylfluorene-co-bis-(4-butylphenyl-bis-N,N-phenyl-1,4-phenylenediamin)) (PFB). However, the embodiment of the present invention is not limited thereto.

[Chemical Formula 5]

[Chemical Formula 6]

The hole transport layer 332 may be deposited by using a vacuum deposition method, a spin coating method, a cast method, or a Langmuir-Blodgett (LB) method. For example, when the vacuum deposition method or the spin coating method is used, the hole transport layer 332 may be deposited under the same deposition conditions as the hole injection layer 331.

The emitting layer 333 may be made of a red (R), green (G), or blue (B) organic material.

For example, when the emitting layer 333 is made of an R organic material, DCM1 (4-(dicyanomethylene)-2-methyl-6-(p-dimethylaminostyryl)-4H-pyran), DCM2 (2-methyl-6-[2-(2,3,6,7-tetrahydro-1H,5H-benzo [ij] quinolizin-9-yl)ethenyl]-4H-pyran-4-ylidene]propane-dinitrile]), Eu(TTA)$_3$ (TTA=thenoyltrifluoroacetone), or DCJTB (4-(dicyanomethylene)-2-t-butyl-6-(1,1,7,7,-tetramethyljulolidyl-9-enyl)-4H-pyran) may be used.

Alternatively, a material including Alq$_3$ doped with a dopant such as DCJTB or a material including Alq$_3$ co-deposited with rubrene and doped with a dopant may be used for the R organic material. Alternatively, a material including 4,4'-N—N'-dicarbazole-biphenyl (CBP) doped with a dopant such as BTPIr may be used for the R organic material. However, the embodiment of the present invention is not limited thereto.

When the emitting layer 333 is made of a G organic material, coumarin 6, C545T, quinacridone, or Ir(ppy)$_3$ may be used. Alternatively, a material including CBP[4,4'-Bis(carbazol-9-yl)biphenyl] doped with a dopant such as Ir(ppy)$_3$ may be used for the G organic material. Further, a material including Alq$_3$ doped with a coumarin dopant may be used for a host. However, the embodiment of the present invention is not limited thereto. As non-limiting examples, the coumarin dopant may be C314S, C343S, C7, C7S, C6, C6S, C314T, or C545T.

When the emitting layer 333 is made of a B organic material, various materials may be used such as oxadiazole dimer dyes(such as, for example, Bis-DAPOXP), spiro compounds (such as, for example, Spiro-DPVBi or Spiro-6P), triarylamine compounds, bis(styryl)amine(DPVBi, DSA), compound (A), Flrpic, CzTT, anthracene, TPB, PPCP, DST, TPA, OXD-4, BBOT, AZM-Zn, or BH-013X (an aromatic hydrocarbon compound containing a naphthalene moiety, produced by Idemitsu (JP)) that is. Alternatively, a material including IDE140 (produced by Idemitsu (JP)) doped with a dopant such as IDE105 (produced by Idemitsu (JP)) may be used for the B organic material. However, the embodiment of the present invention is not limited thereto.

Spiro-DPVBi, compound (A), Flrpic, CzTT, anthracene, TPB, PPCP, DST, TPA, OXD-4, BBOT, and AZM-Zn can be expressed as Chemical Formulas 7 to 18.

[Chemical Formula 7]

Spiro-DPVBi

[Chemical Formula 8]

compound (A)

[Chemical Formula 9]

Flrpic

[Chemical Formula 10]

CzTT

[Chemical Formula 11]

anthracene

[Chemical Formula 12]

TPB

[Chemical Formula 13]

PPCP

[Chemical Formula 14]

DST

[Chemical Formula 15]

TPA

[Chemical Formula 16]

OXD-4

[Chemical Formula 17]

BBOT

[Chemical Formula 18]

AZM-Zn

The emitting layer 333 may be made of a poly-phenylenevinylene (PPV) material or a polyfluorene material.

Further, the emitting layer 333 may have a thickness of 100 Å to 500 Å. As a specific, non-limiting example, the thickness may be 100 Å to 400 Å. The thickness may be adjusted within this range according to the material that constitutes the emitting layer 333. The life-time may be shortened when the thickness of the emitting layer 333 is less than 200 Å. On the other hand, the driving voltage may increase sharply when the thickness of the emitting layer 333 is greater than 500 Å.

Although not shown, an exciton anti-quenching layer may be formed so as prevent an exciton from quenching. If present, the exciton anti-quenching layer should be made of a material having an electron transport capability and an ionization potential greater than that of the material that constitutes the emitting layer 333. For example, the exciton anti-quenching layer may be made of $Alq_3$, Bphen, bis(2-methyl-8-quinolato)-(p-phenylphenolato)-aluminum(Balq), C60, bathocuproine (BCP), or tris(N-arylbenzimidazole) (TPBI). If n-type impurities are not doped into the exciton anti-quenching layer, the exciton anti-quenching layer may have a thickness of 30 Å to 150 Å, preferably, 40 Å to 100 Å. The exciton anti-quenching efficiency may not be significant when the thickness of the exciton anti-quenching layer is less than 30 Å. On the other hand, the driving voltage may rise when the thickness thereof is greater than 150 Å.

The exciton anti-quenching layer may be deposited by using the vacuum deposition method, the spin coating method, or the LB method. For example, when the vacuum deposition method or the spin coating method is used to deposit the exciton anti-quenching layer, the exciton anti-quenching layer may be deposited under the same deposition conditions as the hole injection layer 331.

In the electron transport layer 334 doped with an organic n-type impurity of the organic layer 330, a surface dipole of the interface between the electron transport layer 334 and the second electrode 349 can be regulated according to the organic n-type impurity. Therefore, electrons injected from the second electrode 340 can be effectively transported to the emitting layer 333. For example, the electron transport layer 334 may be made of C60 (fullerene). The organic n-type impurity may be one or more organic n-type impurities and, as a specific, non-limiting example, may be pyronine B or dicarbocyanine iodide or a combination thereof.

The electron transport layer 334 may be formed by using the vacuum deposition method, the spin coating method, the cast method, or the LB method. The electron transport layer 334 may have a thickness of 100 Å to 400 Å, preferably, 150 Å to 250 Å. The electric charge may be out of balance due to an excessive electron transport speed when the thickness of the electron transport layer 334 is less than 100 Å. On the other hand, the driving voltage may rise when the thickness of the electron transport layer 334 is greater than 400 Å.

Figure 2:
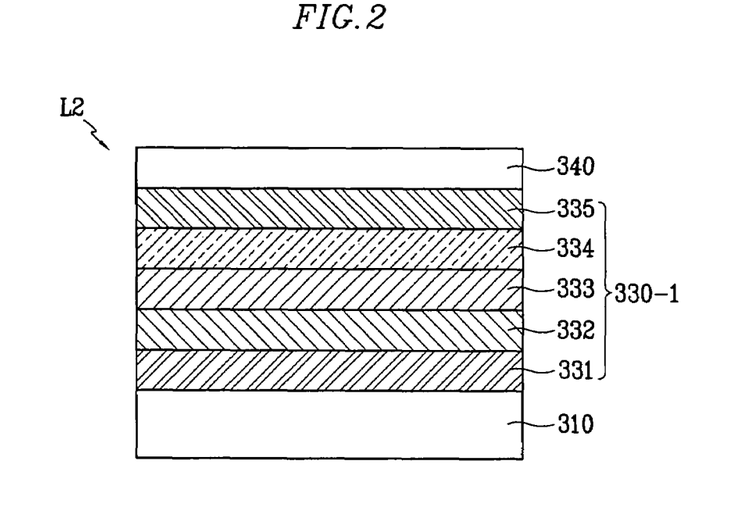
FIG. 2 is a cross-sectional view of an organic light emitting diode according to another embodiment of the present invention.

According to the embodiment shown in FIG. 2, an organic layer 330-1 may be constructed such that the electron transport layer 334 doped with an n-type impurity and an electron injection layer 335 are sequentially laminated between the emitting layer 333 and the second electrode 340. The electron injection layer 335 may be made of Li, Cs, Mg, $BaF_2$, LiF, NaCl, CsF, $Li_2O$, BaO, $CaF_2$, $Cs_2CO_3$, $Cs_2O$, CaO, $MgF_2$, MgO, or Liq (8-hydroxy-quinolinato lithium) expressed by Chemical Formula 19. However, the embodiment of the present invention is not limited thereto.

[Chemical Formula 19]

Liq

The electron injection layer 335 may be formed by using the vacuum deposition method, the spin coating method, the cast method, or the LB method. For example, when the vacuum deposition method or the spin coating method is used to deposit the electron injection layer 335, deposition can be carried out under the same deposition conditions as the hole injection layer 331.

Figure 3:
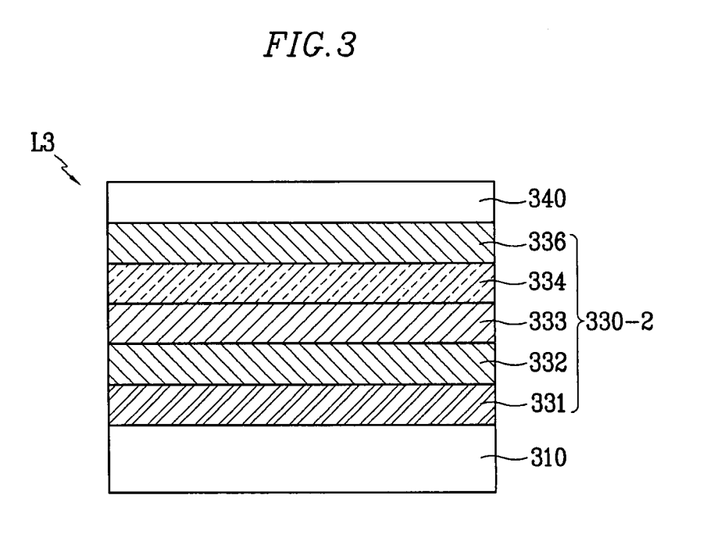
FIG. 3 is a cross-sectional view of an organic light emitting diode according to another embodiment of the present invention.

The electron injection layer 335 may have a thickness of 2 Å to 40 Å. As a specific, non-limiting example, the thickness may be 2 Å to 10 Å. When the thickness of the electron injection layer 335 is less than 2 Å, electrons may not be effectively injected. When the thickness of the electron injection layer 335 is greater than 10 Å, the driving voltage may rise.

as According to the embodiment shown in FIG. 3, an organic layer 330-2 may be constructed such that the electron transport layer 334 doped with an n-type impurity and an undoped electron transport layer 336 are sequentially laminated between the emitting layer 333 and the second electrode 340.

Figure 4:
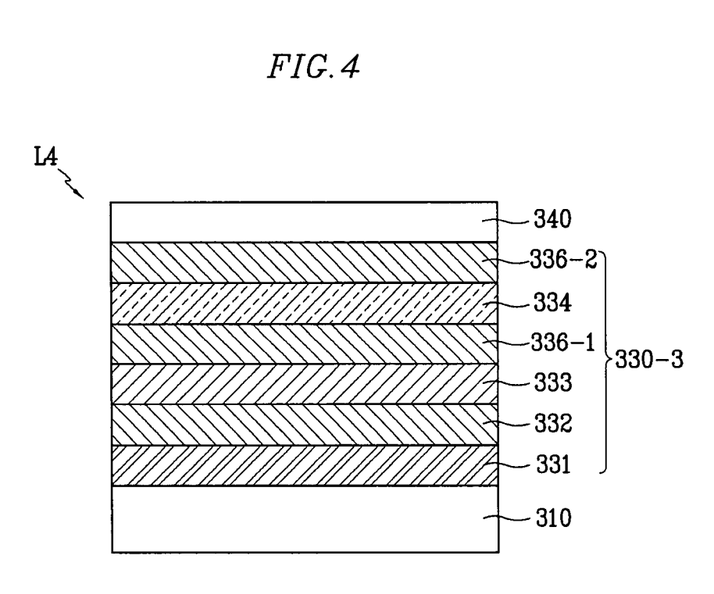
FIG. 4 is a cross-sectional view of an organic light emitting diode according to another embodiment of the present invention.

According to the embodiment shown in FIG. 4, an organic layer 330-3 may be constructed such that a first undoped electron transport layer 336-1, the electron transport layer 334 doped with an n-type impurity, and a second undoped electron transport layer 336-2 are sequentially laminated between the emitting layer 333 and the second electrode 340.

Table 1 shows a comparison result between characteristics of respective Examples wherein the organic light emitting diode includes an electron transport layer doped with organic n-type impurity, in comparison to a Comparison Example wherein the organic light emitting diode does not include an electronic transport layer doped with an organic n-type impurity. The Examples and Comparison Example were tested under the condition that 100 mA/cm$^2$ of DC was supplied, and the emitting layer of the organic light emitting diode was an Alq$_3$ layer. In the Example 1, an electron transport layer was formed between the second electrode and the emitting layer comprising C60 doped with 15 wt % of pyronine B. In Example 2, an electron transport layer was formed between the second electrode and the emitting layer comprising C60 doped with 15 wt % of dicarbocyanine iodide. In Example 3, an electron transport layer comprising a layer of C60 doped with 15 wt % of pyronine B and a layer of C60 were sequentially laminated between the second electrode and the emitting layer. In the case 4, an electron transport layer comprising layer of C60 doped with 15 wt % of dicarbocyanine iodide and a layer of C60 were sequentially laminated between the second electrode and the emitting layer.

TABLE 1

|  | driving voltage (V) | brightness (cd/A) | emission efficiency (lm/W) |
|---|---|---|---|
| Example 1 | 8.7 | 18.4 | 6.7 |
| Example 2 | 9.1 | 19.9 | 6.8 |
| Example 3 | 7.2 | 18.2 | 7.9 |
| Example 4 | 7.3 | 19.4 | 8.3 |
| Comparison Example | 10.5 | 20 | 6.0 |

Referring to Table 1, when the organic light emitting diode included the electron transport layer doped with an organic n-type impurity, the brightness characteristic was similar to that of the comparison example, while a lower driving voltage and a higher light efficiency were obtained in comparison with the comparison example.

Now, an organic light emitting display having the organic light emitting diode L1 according the embodiment of FIG. 1 will be described with reference to FIG. 5. In this embodiment, like reference numerals denote like elements of FIG. 1, and detailed descriptions thereof will be omitted.

Figure 5:
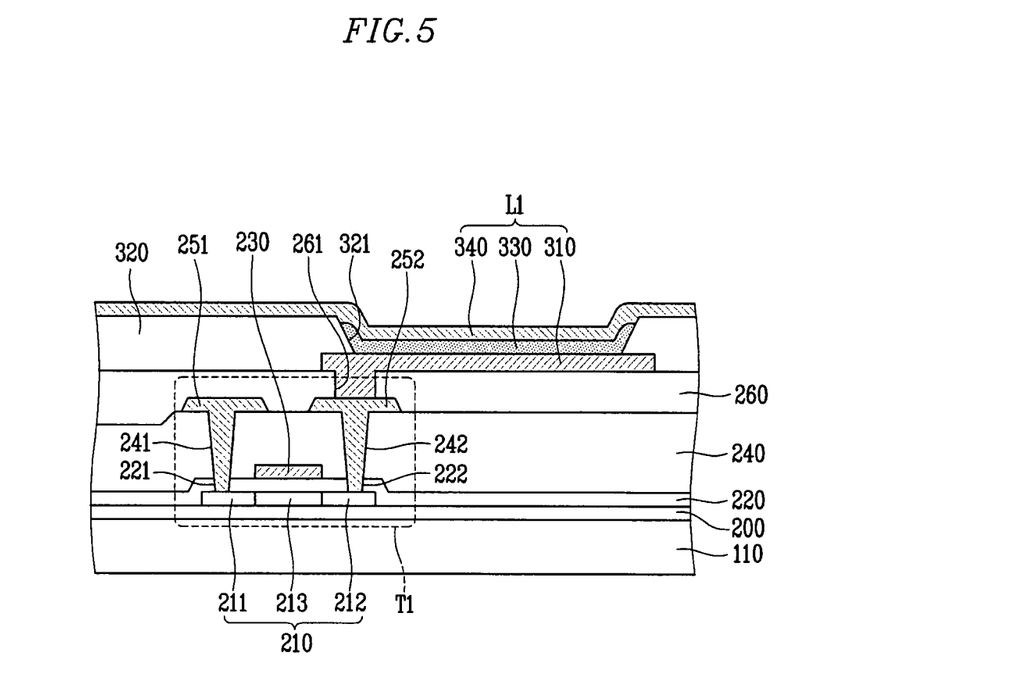
FIG. 5 is a partial cross-sectional view of an organic light emitting display having the organic light emitting diode of FIG. 1.

Referring to FIG. 5, a thin film transistor T1 is formed on a substrate 110 as a driving element. Further, the organic light emitting diode L1 is formed above the thin film transistor T1 with a planarizing layer 260 interposed therebetween, and is electrically connected to the thin film transistor T1, thereby forming a pixel. Although a particular structure of the thin film transistor T1 is shown in FIG. 5 and described herein, it is to be understood that the thin film transistor is not limited to this structure and can be any type of thin film transistor known in the art.

The substrate 110 may be made of an insulation material or a metallic material. As non-limiting examples, the insulation material may be glass or plastic and the metallic material may be stainless steel (SUS).

In the thin film transistor T1, a buffer layer 200 is formed on the substrate 110 and an active layer 210 is formed on the buffer layer 200. The active layer 210 is composed of source and drain regions 211 and 212 and a channel region 213 disposed between the source and drain regions 211 and 212. A gate insulation layer 220 is formed on the buffer layer 200 to cover the active layer 210. A gate electrode 230 is formed on the gate insulation layer 220 above the active layer 210. An intermediate insulation layer 240 is formed on the gate insulation layer 220 to cover the gate electrode 230. Source and drain electrodes 251 and 252 are formed on the intermediate insulation layer 240 such that the source and drain electrodes 251 and 252 are electrically connected to the source and drain regions 211 and 212 through first contact holes 221 and 241 and second contact holes 222 and 242 which are provided to the gate insulation layer 220 and the intermediate insulation layer 240.

The buffer layer 200 prevents impurities contained in the substrate 100 from diffusing when the active layer 210 is formed. For example, the buffer layer 200 may be made of a silicon nitride (SiN) layer or may be formed in a structure in which a SiN layer and a silicon oxide (SiO$_2$) layer are laminated. The gate electrode 230 may be constructed with a metal layer, for example, selected from a group consisting of an MoW layer, an Al layer, a Cr layer, and an Al/Cr layer. The source and drain electrodes 251 and 252 may be constructed with a metal layer, for example, a Ti/Al layer or a Ti/Al/Ti layer.

The first and second electrodes 310 and 340 of the organic light emitting diode L1 respectively function as pixel electrodes. Further, the first electrode 310 can be electrically connected to the drain electrode 252 of the thin film transistor T1 through a via hole 261 formed in the planarizing layer 260. The first electrode 310 is electrically separated from a first electrode (not shown) of an adjacent pixel by a pixel definition layer 320. The first electrode 310 can be in contact with the organic layer 330 through an opening 321 included in the pixel definition layer 320.

Accordingly, when the organic light emitting display includes the organic light emitting diode L1 of FIG. 1, due to a low driving voltage and a high emission efficiency of the organic light emitting diode L1, it is possible to reduce the power consumption of the organic light emitting display.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:
1. An organic light emitting diode comprising:
a first electrode;
an organic layer formed on the first electrode and including
an emitting layer and
an electron transport layer comprising C60 that is doped with an organic n-type impurity wherein the organic n-type impurity is dicarbocyanine iodide or a combination of dicarbocyanine iodide and pyronine B; and
a second electrode formed on the organic layer.

2. The organic light emitting diode of claim 1, wherein the electron transport layer has a thickness in a range of 100 Å to 400Å.

3. The organic light emitting diode of claim 1, wherein the first electrode is an anode and the second electrode is a cathode.

4. An organic light emitting diode comprising:
a first electrode;
an organic layer formed on the first electrode and including the following layers sequentially laminated:
    a hole injection layer,
    a hole transport layer,
    an emitting layer, and
    a doped electron transport layer comprising C60 doped with an organic n-type impurity, wherein the organic n-type impurity is dicarbocyanine iodide or a combination of dicarbocyanine iodide and pyronine B; and
a second electrode formed on the organic layer.

5. The organic light emitting diode of claim 4, wherein the electron transport layer has a thickness in a range of 100Å to 400Å.

6. The organic light emitting diode of claim 4, wherein the organic layer further comprises an electron injection layer formed between the doped electron transport layer and the second electrode.

7. The organic light emitting diode of claim 6, wherein the electron injection layer comprises a material selected from a group consisting of Li, Cs, Mg, $BaF_2$, LiF, NaCl, CsF, $Li_2O$, BaO, $CaF_2$, $Cs_2CO_3$, $Cs_2O$, CaO, $MgF_2$, MgO, and Liq.

8. The organic light emitting diode of claim 4, wherein the organic layer further comprises an undoped electron transport layer formed between the doped electron transport layer and the second electrode.

9. The organic light emitting diode of claim 4, wherein the organic layer further comprises a first undoped electron transport layer formed between the doped electron transport layer and the emitting layer, and a second undoped electron transport layer formed between the doped electron transport layer and the second electrode.

10. The organic light emitting diode of claim 4, wherein the first electrode is an anode and the second electrode is a cathode.

11. An organic light emitting display comprising:
a substrate; and
an organic light emitting diode formed on the substrate and including
    a first electrode,
    an organic layer on the first electrode and including the following layers sequentially laminated:
        a hole injection layer,
        a hole transport layer,
        an emitting layer, and
        a doped electron transport layer comprising C60 doped with an organic n-type impurity, wherein the organic n-type impurity is dicarbocyanine iodide or a combination of dicarbocyanine iodide and pyronine B; and
    a second electrode formed on the organic layer.

12. The organic light emitting display of claim 11, wherein the electron transport layer has a thickness in a range of 100Å to 400Å.

13. The organic light emitting display of claim 11, wherein the organic layer further comprises an electron injection layer formed between the doped electron transport layer and the second electrode.

14. The organic light emitting display of claim 13, wherein the electron injection layer comprises a material selected from a group consisting of Li, Cs, Mg, $BaF_2$, LiF, NaCl, CsF, $Li_2O$, BaO, $CaF_2$, $Cs_2CO_3$, $Cs_2O$, CaO, $MgF_2$, MgO, and Liq.

15. The organic light emitting display of claim 11, wherein the organic layer further comprises an undoped electron transport layer formed between the doped electron transport layer and the second electrode.

16. The organic light emitting display of claim 11, wherein the organic layer further comprises a first undoped electron transport layer formed between the doped electron transport layer and the emitting layer, and a second undoped electron transport layer formed between the doped electron transport layer and the second electrode.

17. The organic light emitting display of claim 11, further comprising a thin film transistor electrically connected to the organic light emitting diode and formed on the substrate.

18. The organic light emitting diode of claim 11, wherein the first electrode is an anode and the second electrode is a cathode.

19. An organic light emitting diode comprising:
a first electrode;
an organic layer formed on the first electrode and including the following layers sequentially laminated:
    a hole injection layer,
    a hole transport layer,
    an emitting layer,
    a doped electron transport layer comprising C60 doped with an organic n-type impurity wherein the organic n-type impurity is dicarbocyanine iodide or a combination of dicarbocyanine iodide and pyronine B, and
    a first undoped electron transport layer comprising C60; and
a second electrode formed on the organic layer.

20. An organic light emitting diode of claim 19, further comprising a second undoped electron transport layer comprising C60, wherein the second undoped electron transport layer is between the emitting layer and the doped electron transport layer.

21. An organic light emitting diode of claim 1, wherein the electron transport layer is doped with dicarbocyanine iodide.

* * * * *